(12) United States Patent
Lenehan et al.

(10) Patent No.: US 7,591,302 B1
(45) Date of Patent: Sep. 22, 2009

(54) PUMP AND FAN CONTROL CONCEPTS IN A COOLING SYSTEM

(75) Inventors: Daniel J. Lenehan, Los Altos Hills, CA (US); Kenneth Goodson, Belmont, CA (US); Thomas W. Kenny, San Carlos, CA (US); Mark Munch, Los Altos, CA (US); Saroj Sahu, Fremont, CA (US)

(73) Assignee: Cooligy Inc., Mountain View, CA (US)

( * ) Notice: Subject to any disclaimer, the term of this patent is extended or adjusted under 35 U.S.C. 154(b) by 321 days.

(21) Appl. No.: 10/731,674

(22) Filed: Dec. 8, 2003

Related U.S. Application Data (60) Provisional application No. 60/489,730, filed on Jul. 23, 2003.

(51) Int. Cl.
*F24F 11/06* (2006.01)
(52) U.S. Cl. .................................. 165/247; 165/104.33
(58) Field of Classification Search ................. 165/247, 165/244, 104.33; 62/185, 228.4
See application file for complete search history.

(56) References Cited

U.S. PATENT DOCUMENTS

| | | | |
|---|---|---|---|
| 596,062 A | 12/1897 | Firey | |
| 2,273,505 A | 2/1942 | Florian | |
| 3,267,859 A | 8/1966 | Jutila | 103/1 |
| 3,524,497 A | 8/1970 | Chu et al. | 165/80 |
| 3,554,669 A | 1/1971 | Reader | 417/48 |

(Continued)

FOREIGN PATENT DOCUMENTS

CN 97212126.9 3/1997

(Continued)

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059-2063.

(Continued)

*Primary Examiner*—Ljiljana (Lil) V Ciric
(74) *Attorney, Agent, or Firm*—Haverstock & Owens LLP (57) ABSTRACT

A method of and apparatus for cooling heat-generating devices in a cooling system is disclosed. The apparatus includes various sensors, control schemes and thermal models, to control pump flow rates and fan flow rates to minimize power consumption, fan noise, and noise transients. The apparatus further includes at least one heat-generating device, at least one heat exchanger, and at least one heat rejector. The apparatus can also include many pumps and fans. The method includes controlling a fluid flow rate of at least one pump and an air flow rate of at least one fan, in a cooling system for cooling at least one device. The method comprises the steps of: providing at least one temperature sensor coupled to measure a temperature value of each device; receiving the temperature value from each temperature sensor; and providing a controller to selectively control the fluid flow rate and the air flow rate, based on each temperature value. The method can further include the step of filling at least a portion of a heat exchanger with a thermal capacitance medium for maintaining the temperature value of the device below a maximum allowable temperature during thermal transients, wherein the heat exchanger is thermally coupled to the device.

10 Claims, 6 Drawing Sheets

U.S. PATENT DOCUMENTS

| | | |
|---|---|---|
| 3,654,988 A | 4/1972 | Clayton, III |
| 3,817,321 A | 6/1974 | von Cube et al. |
| 3,823,572 A | 7/1974 | Cochran, Jr. |
| 3,923,426 A | 12/1975 | Theeuwes |
| 3,929,154 A | 12/1975 | Goodwin |
| 3,993,123 A | 11/1976 | Chu et al. ............... 165/80 |
| 4,109,707 A | 8/1978 | Wilson et al. |
| 4,138,996 A | 2/1979 | Cartland |
| 4,194,559 A | 3/1980 | Eastman |
| 4,211,208 A | 7/1980 | Lindner |
| 4,248,295 A | 2/1981 | Ernst et al. |
| 4,296,455 A | 10/1981 | Leaycraft et al. ............ 361/383 |
| 4,332,291 A | 6/1982 | Mulock-Bentley ........... 165/76 |
| 4,485,429 A | 11/1984 | Mittal |
| 4,561,040 A | 12/1985 | Eastman et al. |
| 4,568,431 A | 2/1986 | Polan et al. .................. 204/13 |
| 4,664,181 A | 5/1987 | Sumberg |
| 4,793,405 A | 12/1988 | Diggelmann et al. ... 165/104.33 |
| 4,866,570 A | 9/1989 | Porter |
| 4,884,331 A | 12/1989 | Hinshaw ..................... 29/558 |
| 4,894,709 A | 1/1990 | Phillips et al. |
| 4,896,719 A | 1/1990 | O'Neill et al. |
| 4,908,112 A | 3/1990 | Pace |
| 5,009,760 A | 4/1991 | Zare et al. |
| 5,016,090 A | 5/1991 | Galyon et al. ................. 357/82 |
| 5,058,627 A | 10/1991 | Brannen |
| 5,070,040 A | 12/1991 | Pankove |
| 5,088,005 A | 2/1992 | Ciaccio |
| 5,096,388 A | 3/1992 | Weinberg |
| 5,099,311 A | 3/1992 | Bonde et al. |
| 5,099,910 A | 3/1992 | Walpole et al. |
| 5,105,430 A | 4/1992 | Mundinger et al. ........... 372/35 |
| 5,125,451 A | 6/1992 | Matthews |
| 5,131,233 A | 7/1992 | Cray et al. |
| 5,199,487 A | 4/1993 | DiFrancesco et al. ....... 165/168 |
| 5,203,401 A | 4/1993 | Hamburgen et al. |
| 5,218,515 A | 6/1993 | Bernhardt |
| 5,219,278 A | 6/1993 | Van Lintel |
| 5,232,047 A | 8/1993 | Matthews |
| 5,239,200 A | 8/1993 | Messina et al. |
| 5,247,800 A | 9/1993 | Mruzek et al. ................ 62/51.1 |
| 5,263,251 A | 11/1993 | Matthews |
| 5,269,372 A | 12/1993 | Chu et al. .................. 165/80.4 |
| 5,274,920 A | 1/1994 | Matthews |
| 5,299,635 A | 4/1994 | Abraham ..................... 165/173 |
| 5,308,429 A | 5/1994 | Bradley ................... 156/306.6 |
| 5,309,319 A | 5/1994 | Messina |
| 5,317,805 A | 6/1994 | Hoopman et al. |
| 5,325,265 A | 6/1994 | Turlik et al. |
| 5,336,062 A | 8/1994 | Richter |
| 5,365,400 A | 11/1994 | Ashiwake et al. ........... 361/752 |
| 5,371,529 A | 12/1994 | Eguchi et al. |
| 5,380,956 A | 1/1995 | Loo et al. |
| 5,383,340 A | 1/1995 | Larson et al. |
| 5,427,174 A | 6/1995 | Lomolino, Sr. et al. |
| 5,436,793 A | 7/1995 | Sanwo et al. |
| 5,441,613 A | 8/1995 | McCormick et al. |
| 5,459,099 A | 10/1995 | Hsu |
| 5,514,906 A | 5/1996 | Love et al. |
| 5,520,244 A | 5/1996 | Mundinger et al. .... 165/104.33 |
| 5,534,471 A | 7/1996 | Carolan et al. |
| 5,544,696 A | 8/1996 | Leland |
| 5,548,605 A | 8/1996 | Benett et al. |
| 5,564,497 A | 10/1996 | Fukuoka et al. ............. 165/152 |
| 5,579,828 A | 12/1996 | Reed et al. |
| 5,585,069 A | 12/1996 | Zanzucchi et al. |
| 5,632,876 A | 5/1997 | Zanzucchi et al. |
| 5,641,400 A | 6/1997 | Kaltenbach et al. |
| 5,685,966 A | 11/1997 | Aaron et al. ................. 204/600 |
| 5,692,558 A | 12/1997 | Hamilton et al. |
| 5,696,405 A | 12/1997 | Weld |
| 5,703,536 A | 12/1997 | Davis et al. |
| 5,704,416 A | 1/1998 | Larson et al. |
| 5,726,495 A | 3/1998 | Aihara et al. ................ 257/722 |
| 5,727,618 A | 3/1998 | Mundinger et al. |
| 5,759,014 A | 6/1998 | Van Lintel |
| 5,761,037 A | 6/1998 | Anderson et al. ............ 361/700 |
| 5,763,951 A | 6/1998 | Hamilton et al. |
| 5,796,580 A | 8/1998 | Komatsu et al. ............. 361/687 |
| 5,800,690 A | 9/1998 | Chow et al. |
| 5,801,442 A | 9/1998 | Hamilton et al. |
| 5,810,077 A | 9/1998 | Nakamura et al. .......... 165/153 |
| 5,811,062 A | 9/1998 | Wegeng et al. .............. 422/129 |
| 5,829,514 A | 11/1998 | Smith et al. .................... 165/78 |
| 5,835,345 A | 11/1998 | Staskus et al. |
| 5,836,750 A | 11/1998 | Cabuz |
| 5,839,290 A | 11/1998 | Nazeri ......................... 62/119 |
| 5,858,188 A | 1/1999 | Soane et al. |
| 5,863,708 A | 1/1999 | Zanzucchi et al. |
| 5,869,004 A | 2/1999 | Parce et al. |
| 5,870,823 A | 2/1999 | Bezama et al. |
| 5,874,795 A | 2/1999 | Sakamoto |
| 5,876,655 A | 3/1999 | Fisher |
| 5,880,017 A | 3/1999 | Schwiebert et al. |
| 5,880,524 A | 3/1999 | Xie |
| 5,901,037 A | 5/1999 | Hamilton et al. |
| 5,927,390 A | 7/1999 | Lehman ...................... 165/122 |
| 5,936,192 A | 8/1999 | Tauchi |
| 5,940,270 A | 8/1999 | Puckett |
| 5,942,093 A | 8/1999 | Rakestraw et al. |
| 5,964,092 A | 10/1999 | Tozuka et al. |
| 5,965,001 A | 10/1999 | Chow et al. |
| 5,965,813 A | 10/1999 | Wan et al. |
| 5,978,220 A | 11/1999 | Frey et al. |
| 5,983,997 A | 11/1999 | Hou ............................ 165/144 |
| 5,989,402 A | 11/1999 | Chow et al. |
| 5,997,713 A | 12/1999 | Beetz, Jr. et al. |
| 5,998,240 A | 12/1999 | Hamilton et al. |
| 6,007,309 A | 12/1999 | Hartley |
| 6,010,316 A | 1/2000 | Haller et al. |
| 6,012,902 A | 1/2000 | Parce .......................... 417/48 |
| 6,013,164 A | 1/2000 | Paul et al. |
| 6,019,882 A | 2/2000 | Paul et al. |
| 6,054,034 A | 4/2000 | Soane et al. |
| 6,068,752 A | 5/2000 | Dubrow et al. |
| 6,084,178 A | 7/2000 | Cromwell ..................... 174/35 |
| 6,086,330 A | 7/2000 | Press et al. ................... 416/223 |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A | 8/2000 | Fuesser et al. |
| 6,103,199 A | 8/2000 | Bjornson et al. ............. 422/100 |
| 6,106,685 A | 8/2000 | McBride et al. ............. 204/600 |
| 6,119,729 A | 9/2000 | Oberholzer et al. |
| 6,126,723 A | 10/2000 | Drost et al. |
| 6,129,145 A | 10/2000 | Yamamoto et al. |
| 6,131,650 A | 10/2000 | North et al. |
| 6,146,103 A | 11/2000 | Lee et al. |
| 6,154,226 A | 11/2000 | York et al. ................ 346/140.1 |
| 6,154,363 A | 11/2000 | Chang |
| 6,159,353 A | 12/2000 | West et al. |
| 6,166,907 A | 12/2000 | Chien ........................ 361/699 |
| 6,171,067 B1 | 1/2001 | Parce |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,210,986 B1 | 4/2001 | Arnold et al. |
| 6,216,343 B1 | 4/2001 | Leland et al. |
| 6,221,226 B1 | 4/2001 | Kopf-Sill |
| 6,227,809 B1 | 5/2001 | Forster et al. |
| 6,234,240 B1 | 5/2001 | Cheon |
| 6,238,538 B1 | 5/2001 | Parce et al. |
| 6,251,254 B1 | 6/2001 | Katoh et al. ................ 205/287 |
| 6,260,579 B1 | 7/2001 | Yokota et al. ............... 137/807 |

| | | | |
|---|---|---|---|
| 6,272,012 B1 | 8/2001 | Medin et al. ............... 361/690 |
| 6,277,257 B1 | 8/2001 | Paul et al. |
| 6,287,440 B1 | 9/2001 | Arnold et al. |
| 6,301,109 B1 | 10/2001 | Chu et al. |
| 6,313,992 B1 | 11/2001 | Hildebrandt |
| 6,317,326 B1 | 11/2001 | Vogel et al. |
| 6,321,791 B1 | 11/2001 | Chow |
| 6,322,753 B1 | 11/2001 | Lindberg et al. |
| 6,324,058 B1 | 11/2001 | Hsiao |
| 6,324,075 B1 | 11/2001 | Unrein et al. ............... 361/816 |
| 6,337,794 B1 | 1/2002 | Agonafer et al. |
| 6,351,384 B1 | 2/2002 | Daikoku et al. |
| 6,366,462 B1 | 4/2002 | Chu et al. ................... 361/699 |
| 6,367,544 B1 | 4/2002 | Calaman ..................... 165/135 |
| 6,385,044 B1 | 5/2002 | Colbert et al. .............. 361/700 |
| 6,388,317 B1 | 5/2002 | Reese |
| 6,388,385 B1 | 5/2002 | McGinn et al. ........ 315/111.91 |
| 6,396,706 B1 | 5/2002 | Wohlfarth .................. 361/760 |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. |
| 6,416,642 B1 | 7/2002 | Alajoki et al. |
| 6,417,060 B2 | 7/2002 | Tavkhelidze et al. |
| 6,424,531 B1 | 7/2002 | Bhatti et al. |
| 6,438,984 B1 | 8/2002 | Novotny et al. |
| 6,443,222 B1 | 9/2002 | Yun et al. |
| 6,443,704 B1 | 9/2002 | Darabi et al. ................. 417/50 |
| 6,444,461 B1 | 9/2002 | Knapp et al. |
| 6,457,515 B1 | 10/2002 | Vafai et al. |
| 6,469,893 B1 | 10/2002 | Frutschy et al. ............. 361/700 |
| 6,478,258 B1 | 11/2002 | Yee ............................ 244/163 |
| 6,495,015 B1 | 12/2002 | Schoeniger et al. |
| 6,537,437 B1 | 3/2003 | Galambos et al. |
| 6,543,521 B1 | 4/2003 | Sato et al. |
| 6,553,253 B1 | 4/2003 | Chang |
| 6,572,749 B1 | 6/2003 | Paul et al. |
| 6,578,626 B1 | 6/2003 | Calaman et al. ............ 165/80.4 |
| 6,581,388 B2 | 6/2003 | Novotny et al. |
| 6,587,343 B2 | 7/2003 | Novotny et al. |
| 6,588,498 B1 | 7/2003 | Reysin et al. |
| 6,591,625 B1 | 7/2003 | Simon |
| 6,626,236 B1 | 9/2003 | Bandoh et al. .............. 165/206 |
| 6,632,655 B1 | 10/2003 | Mehta et al. |
| 6,651,736 B2 | 11/2003 | Chiu et al. ................... 165/185 |
| 6,675,875 B1 | 1/2004 | Vafai et al. .................. 165/80.4 |
| 6,700,785 B2 | 3/2004 | Berry et al. ................. 361/726 |
| 6,718,781 B2 | 4/2004 | Freund et al. ................. 62/199 |
| 6,719,535 B2 | 4/2004 | Rakestraw et al. ............. 417/50 |
| 6,729,383 B1 | 5/2004 | Cannell et al. ............. 165/80.3 |
| 6,757,169 B2 | 6/2004 | Kondo et al. ................ 361/699 |
| 6,763,880 B1 | 7/2004 | Shih ......................... 165/80.4 |
| 6,770,183 B1 | 8/2004 | Hencken et al. ............. 204/600 |
| 6,787,052 B1 | 9/2004 | Vaganov ...................... 216/57 |
| 6,795,312 B2 | 9/2004 | Narakino et al. ............ 361/687 |
| 6,796,372 B2 | 9/2004 | Bear ...................... 165/104.21 |
| 6,826,922 B2 * | 12/2004 | Patel et al. .................. 62/228.4 |
| 6,865,081 B2 | 3/2005 | Meyer et al. ................ 361/699 |
| 6,903,929 B2 | 6/2005 | Prasher et al. ............... 361/699 |
| 6,934,154 B2 | 8/2005 | Prasher et al. ............... 361/699 |
| 6,955,212 B1 | 10/2005 | Hsieh ........................ 165/80.4 |
| 6,986,382 B2 | 1/2006 | Upadhya et al. ........... 165/80.4 |
| 6,992,891 B2 | 1/2006 | Mallik et al. ................ 361/704 |
| 7,009,843 B2 | 3/2006 | Lee et al. .................... 361/704 |
| 7,243,704 B2 | 7/2007 | Tustaniwskyi et al. ......... 165/80 |
| 7,334,630 B2 * | 2/2008 | Goodson et al. ........ 165/104.33 |
| 7,455,103 B2 | 11/2008 | Sato et al. ................... 165/299 |
| 2001/0016985 A1 | 8/2001 | Insley et al. |
| 2001/0024820 A1 | 9/2001 | Mastromatteo et al. |
| 2001/0044155 A1 | 11/2001 | Paul et al. |
| 2001/0045270 A1 | 11/2001 | Bhatti et al. |
| 2001/0046703 A1 | 11/2001 | Burns et al. |
| 2001/0055714 A1 | 12/2001 | Cettour-Rose et al. |
| 2002/0011330 A1 | 1/2002 | Insley et al. |
| 2002/0075645 A1 | 6/2002 | Kitano et al. |
| 2002/0096312 A1 | 7/2002 | Korin ........................... 165/58 |
| 2002/0121105 A1 | 9/2002 | McCarthy, Jr. et al. |
| 2002/0134543 A1 | 9/2002 | Estes et al. ................... 165/277 |
| 2002/0152761 A1 | 10/2002 | Patel et al. .................. 62/259.2 |
| 2003/0022505 A1 | 1/2003 | Ouellet et al. ............... 438/704 |
| 2003/0062149 A1 | 4/2003 | Goodson et al. ....... 165/104.11 |
| 2003/0121274 A1 | 7/2003 | Wightman |
| 2004/0008483 A1 | 1/2004 | Cheon ....................... 361/687 |
| 2004/0040695 A1 | 3/2004 | Chesser et al. |
| 2004/0050231 A1 | 3/2004 | Chu et al. ..................... 83/574 |
| 2004/0057211 A1 | 3/2004 | Kondo et al. ............... 361/696 |
| 2004/0089008 A1 | 5/2004 | Tilton et al. |
| 2004/0099410 A1 | 5/2004 | Ghosh ........................ 165/185 |
| 2004/0120827 A1 | 6/2004 | Kim et al. ..................... 417/48 |
| 2004/0126863 A1 | 7/2004 | Fidock et al. ............... 435/196 |
| 2004/0188076 A1 | 9/2004 | Lee ............................. 165/174 |
| 2004/0206477 A1 | 10/2004 | Kenny et al. ............... 165/80.4 |
| 2004/0221604 A1 | 11/2004 | Ota et al. .................... 62/259.2 |
| 2005/0082666 A1 | 4/2005 | Lee et al. ..................... 257/728 |
| 2005/0084385 A1 | 4/2005 | Corbin et al. ................. 417/53 |
| 2005/0133200 A1 | 6/2005 | Malone et al. ............. 165/80.4 |
| 2005/0247433 A1 | 11/2005 | Corrado et al. ............ 165/80.4 |
| 2005/0257532 A1 | 11/2005 | Ikeda et al. ................... 62/3.7 |
| 2005/0259393 A1 | 11/2005 | Vinson et al. ............... 361/690 |
| 2006/0037739 A1 | 2/2006 | Utsunomiya ........... 165/104.33 |
| 2006/0139882 A1 | 6/2006 | Mikubo et al. .............. 361/699 |
| 2006/0161311 A1 | 7/2006 | Vinson et al. ............... 700/300 |
| 2006/0187639 A1 | 8/2006 | Carswell .................... 361/699 |
| 2008/0013283 A1 | 1/2008 | Gilbert et al. ............... 361/715 |

FOREIGN PATENT DOCUMENTS

| | | |
|---|---|---|
| EP | 1 154 476 A1 | 11/2001 |
| EP | 1 520 993 A2 | 6/2005 |
| JP | 6-326226 | 11/1994 |
| JP | 9-102568 | 4/1997 |
| JP | 10-99592 | 4/1998 |
| JP | 10-208781 * | 8/1998 |
| JP | 10223811 | 8/1998 |
| JP | 2000-277540 | 10/2000 |
| JP | 2001-326311 | 11/2001 |
| JP | 306614 | 3/2005 |
| TW | 402680 | 9/2000 |
| TW | 449040 | 8/2001 |
| TW | 495062 | 7/2002 |
| TW | 510490 | 11/2002 |
| WO | WO 2004/036040 A1 | 4/2004 |
| WO | WO 2004/076857 A3 | 9/2004 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Microcech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packages, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromaching", Sep. 1999, Microfluidic Devices and Systems II, vol. 3877, pp. 267-272.

G. Mohiuddin Mala et al., "Heat transfer and fluid flow in microchannels", 1997, Int. J. Mass transfer, vol. 40, No. 13, pp. 3079-3088, printed in Great Britain.

J. M. Cuta et al., "Fabrication and Testing of Micro-Channel Heat Exchangers", SPIE Microlithography and Metrology in Micromaching, vol. 2640, 1995, pp. 152-160.

Linan Jiang et al., "A Micro-Channel Heat Sink with Integrated Temperature Sensors for Phase Transition Study", 1999, $12^{th}$ IEEE International Conference on Micro Electro Mechanical Systems, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yongendra Joshi, "Heat out of small packages", Dec. 2001, Mechanical Engineer, pp. 56-58.

A. Rostami et al., "Liquid Flow and Heat Transfer in Microchannels: a Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000) pp. 787-790.

J. C. Y. Koh et al., "Heat Transfer of Microstructure for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufactunng Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloid and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperatures Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Crititical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 1, Jan. 1995, pp. 55-56.

"Self-Contained Active Heat Dissipation Device", IBM Technical Disclosure Bulletin vol. 39, No. 4, Apr. 1996, pp. 115-116.

C. J. Keller et al. "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

A. L. Pacuzzo et al., "Integrated Circuit Module Package Cooling Structure", IBM Technical Disclosure Bulletin, vol. 20, No. 10, Mar. 1978, pp. 3898-3899.

R. D. Durand et al., "Flexible Thermal Conductor for Electronic Module", IBM Technical Disclosure Bulletin, vol. 20, No. 11A, Apr. 1978, p. 4343.

D. Balderes et al.,"Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, Vol. 20, No. 11A, Apr. 1978, pp. 4334-4335.

A. J. Arnold, "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (or Other Liquid-Cooled Logic Package) by Reducing the Coolant Temperature", IBM Technical Disclosure Bulletin, vol. 32 No. 5A, Oct 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosre Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 9, Sep. 1994, p. 171.

Youngcheol Joo et al., "Fabrication of Monolithic Microchannels for IC Chip Cooling", 1995, IEEE Micro Electro Mechanical Systems, pp. 362-367.

Jaisree Moorthy et al., *Active control of electroosmotic flow in microchannels using light*, Jan. 26, 2001, Sensors and Actuators B 75, pp. 223-229.

Andreas Manz et al., *Electroosmotic pumping and electrophoretic separations for miniaturized chemical analysis systems*, Sep. 16, 1994, J.Micromech. Microeng. 4 (1994), pp. 257-265, printed in the U.K.

E. B. Cummings et al., *Irrotationality of uniform electroosmosis*, Sep. 1999, Part of the SPIE Conference on Microfluidic Devices and Systems II, SPIE vol. 3877, pp. 180-189.

Stephen C. Jacobson et al., *Fused Quartz Substrates for Microchip Electrophoresis*, Jul. 1, 1995, Analytical Chemistry, vol. 67, No. 13, pp. 2059-2063.

Haim H. Bau, *Optimization of conduits' shape in micro heat exchangers*, Dec. 10, 1997, International Journal of Heat and Mass Transfer 41 (1998), pp. 2717-2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405-410.

M. B. Bowers et al.,, *Two-Phase Electronic Cooling Using Mini-Channel and Micro-Channel Heat Sinks: Part 2-Flow Rate and Pressure Drop Constraints*, Dec. 1994, Journal of Electronic Packaging 116, pp. 298-305.

Meint J. de Boer et al., *Micromachining of Buried Micro Channels in Silicon*, Mar. 2000, Journal of Microelectromechanical systems, vol. 9, No. 1, pp. 94-103.

S.B. Choi et al., *Fluid Flow and Heat Transfer in Microtubes*, 1991, DSC-vol. 32, Micromechanical sensors, Actuators, and Systems, ASME 1991, pp. 123-134.

S. F. Choquette, M. Faghri et al., *Optimum Design of Microchannel Heat Sinks*, 1996, DSC-vol. 59, Microelectromechanical Systems (MEMS), ASME 1996, pp. 115-126.

David Copeland et al., *Manifold Microchannel Heat Sinks: Theory and Experiment*, 1995, EEP-vol. 10-2, Advances in Electronic Packaging ASME 1995, pp. 829-835.

J. M. Cuta et al., *Forced Convection Heat Transfer in Parallel Channel Array Microchannel Heat Exchanger*, 1996, 1996, PID-vol. 27 HTD-vol. 338, Advances in Energy efficiency, Heat/Mass Transfer Enhancement, ASME 1996, pp. 17-23.

K. Fushinobu et al., *Heat Generation and Transport in Sub-Micron Semiconductor Devices*, 1993, HTD-vol. 253, Heat Transfer on the Microscale, ASME 1993, pp. 21-28.

Charlotte Gillot et al., *Integrated Micro Heat Sink for Power Multichip Module*, Sep. 3, 1999, IEEE Transactions on Industry Applications, vol. 36, No. 1. Jan./Feb. 2000, pp. 217-221.

John Gooding, *Microchannel heat exchangers—a review*, SPIE vol. 1997 High Heat Flux Engineering II (1993), pp. 66-82.

Koichiro Kawano et al., *Micro Channel Heat Exchanger for Cooling Electrical Equipment*, HTD-vol. 361-3/PID-vol. 3, Proceeding of the ASME Heat Transfer Division—vol. 3, ASME 1998, pp. 173-188.

Chad Harris et al., *Design and Fabrication of a Cross Flow Micro Heat Exchanger*, Dec. 2000, Journal of Microelectromechanical Systems, vol. 9, No. 4, pp. 502-508.

George M. Harpole et al., *Micro-Channel Heat Exchanger Optimization*, 1991, Seventh IEEE Semi-Therm Symposium, pp. 59-63.

Pei-Xue Jiang et al., *Thermal-hydraulic performance of small scale micro-channel and prous-media heat-exchangers*, 2001, International Journal of Heat and Mass Transfer 44 (2001), pp. 1039-1051.

X.N. Jiang et al., *Laminar Flow Through Microchannels Used for Microscale Cooling Systems*, 1997, IEEE/CPMT Electronic Packaging Technology Coriterence, pp. 119-122, Singapore.

David Bazeley Tuckerman, *Heat-Transfer Microstructures for Integrated Circuits*, Feb. 1984, pp. ii-xix, pp. 1-141.

M Esashi, *Silicon micromachining for integrated microsystems*, 1996, Vacuum/vol. 47/Nos. 6-8/pp. 469-474.

T.S. Ravigururajan et al., *Effects of Heat Flux on Two-Phase Flow characteristics of Refrigerant Flows in a Micro-Channel Heat Exchanger*, HTD-vol. 329, National Heat Transfer Conference, vol. 7, ASME 1996, pp. 167-178.

T.S. Ravigruruajan et al., *Single-Phase Flow Thermal Performance Characteristics of a Parallel Micro-Channel Heat Exchanger*, 1996, HTD-vol. 329, National Heat Transfer Conference, vol. 7, ASME 1996, pp. 157-166.

T.S. Ravigururajan et al., *Liquid Flow Characteristics in a Diamond-Pattern Micro-Heat-Exchanger*, DSC-vol.59 Microelectromechanical Systems (IMEMS), ASME 1996, pp. 159-166.

T.S. Raviguruajan, *Impact of Channel Geometry on Two-Phase Flow Heat Transfer Characteristics of Refrigerants in Microchannel Heat Exchangers*, May 1998, Journal of Heat Transfer, vol. 120, pp. 485-491.

J. Pfahler et al., *Liquid Transport in Micron and Submicron Channels*, Mar. 1990, Sensors and Actuators, A21-A23 (1990), pp. 431-434.

Kenneth Pettigrew et al., *Performance of a MEMS based Micro Capillary Pumped Loop for Chip-Level Temperature Control*, 2001, The 14$^{th}$ IEEE International Conference on Micro Electro Mechanical Systems, pp. 427-430.

C. Perret et al., *Microchannel integrated heat sinks in silicon technology*, Oct. 12-15, 1998, The 1998 IEEE Industry Applications Conference, pp. 1051-1055.

X.F. Peng et al., *Convective heat transfer and flow friction for water flow in microchannel structures*, 1996, Int. J. Heat Mass Transfer, vol. 39, No. 12, pp. 2599-2608, printed in Great Britain.

X.F. Peng et al., *Experimental investigation of heat transfer in flat plates with rectangular microchannels*, 1994, Int. J. Heat Mass Transfer, vol. 38, No. 1, pp. 127-137, printed in Great Britain.

X.F. Peng et al., *Cooling Characteristics with Microchanneled Structures*, 1994, Enhanced Heat Transfer, vol. 1, No. 4, pp. 315-326, printed in the United States of America.

Yoichi Murakami et al., *Parametric Optimization of Multichananneled Heat Sinks for VLSI Chip Cooling*, Mar. 2002, IEEE Transaction on Components and Packaging Technologies, Vol. 24, No. 1, pp. 2-9.

D. Mundinger et al., *High average power 2-D laser diode arrays or silicon microchannel coolers*, CLEO '89/Friday Morning/404.

L.J. Missaggia et al., *Microchannel Heat Sinks for Two-Dimensional High-Power-Density Diode Laser Arrays*, 1989, IEEE Journal of Quantum Electronics, vol. 25, No. 9, Sep. 1989, pp. 1989-1992.

M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45-50.

C.R. Friedrich et al., *Micro heat exchangers fabricated by diamond machining*, Jan. 1994, Precision Engineering, Vol. 16, No. 1, pp. 56-59.

Mali Mahalingam, *Thermal Management in Semiconductor Device Packaging*, 1985, Proceedings of the IEEE, vol. 73, No. 9, Sep. 1985, pp. 1396-1404.

T.M. Adams et al., *An experimental investigation of single-phase forced convection in microchannels*, 1997, Int. J. Heat Mass Transfer, vol. 41, Nos. 6-7, pp. 851-857, Printed in Great Britain.

T.M. Adams et al., *Applicability of traditional turbulent single-phase forced convection correlations to non-circular micrhchannels*, 1999, Int. J. Heat and Transfer 42 (1999) pp. 4411-4415.

Bassam Badran et al., *Experimental Results for Low-Temperature Silicon Micromachined Micro Heat Pipe Arrays Using Water and Methanol as Working Fluids*, May 31, 1997, Experimental Heat Transfer, 10: pp 253-272.

D. Jed Harrison et al., *Electroosmotic Pumping Within A Chemical Sensor System Integrated on Silicon*, Session C9 Chemical Sensors and Systems for Liquids, Jun. 26, 1991, pp. 792-795.

Kurt Seller et al., *Electroosmotic Pumping and Valveless Control of Fluid Flow within a Manifold of Capillaries on a Glass Chip*, 1994, Analytical Chemistry, vol. 66, No. 20, Oct. 15, 1994, pp. 3485-3491.

Philip H. Paul et al., *Electrokinetic Generation of High Pressures Using Porous Microstructures*, 1998, Micro-Total Analysis Systems, pp. 49-52.

Gh. Mohiuddin Mala et al., *Flow characteristics of water through a microchannel between two parallel plates with electrokinetic effects*, 1997, Int. J. Heat and Fluid Flow, vol. 18, No. 5, pp. 489-496.

W.E. Morf et al., *Partial electroosmotic pumping in complex capillary systems Part 1: Principles and general theoretical approach*, Oct. 16, 2000, Sensors and Actuators B 72 (2001), pp. 266-272.

M. Esashi, *Silicon micromachining and micromachines*, Sep. 1, 1993, Wear, vol. 168, No. 1-2, (1993), pp. 181-187.

Stephanus Buttgenbach et al., *Microflow devices for miniaturized chemical analysis systems*, Nov. 4-5, 1998, SPIE-Chemical Microsensors and Applications, vol. 3539, pp. 51-61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89-102.

Linan Jiang et al., *Closed-Loop Electroosmotic Microchannel Cooling System for VLSI Circuits*, Mechanical Engineering Dept. Stanford University, pp. 1-27.

Susan L. R. Barker et al., *Fabrication, Derivatization and Applications of Plastic Microfluidic Devices*, Proceedings of SPIE, vol. 4205. Nov. 5-8, 2000, pp. 112-118.

Timothy E. McKnight et al., *Electroosmotically Induced Hydraulic Pumping with Integrated Electrodes on Microfluidic Devices*, 2001, Anal. Chem., vol. 73, pp. 4045-4049.

Chris Bourne, *Cool Chips plc Receives Nanotech Manufacturing Patent*, Jul. 31, 2002, pp. 1-2.

Frank Wagner et al., *Electroosmotic Flow Control in Micro Channels Produced by Scanning Excimer Laser Ablation*, 2000, Proceedings of SPIE vol. 4088, Jun. 14-16, 2000, pp. 337-340.

H. A. Goodman, *Data Processor Cooling With Connection to Maintain Flow Through Standby Pump*, Dec. 1983, IBM Technical Disclosure Bulletin, vol. 26, No. 7A, p. 3325.

*Electroerosion Micropump*, May 1990, IBM Technical Disclosure Bulletin, vol. 32, No. 12, pp. 342-343.

Shulin Zeng et al., *Fabrication and Characterization of Electrokinetic Micro Pumps*, 2000 Inter Society Conference on Thermal Phenomena, pp. 31-35.

A. Manz et al., *Integrated Electoosmotic Pumps and Flow Manifolds for Total Chemical Analysis System*, 1991, Inter. Conf. on Solid-State Sensors and Actuators, pp. 939-941.

O. T. Guenat et al., *Partial electroosmotic pumping in complex capillary systems Part: 2 Fabrication and application of a micro total analysis system suited for continuous volumetric nanotitrations*, Oct. 16, 2000, Sensors and Actuators B 72 (2001) pp. 273-282.

J. G. Sunderland *Electrokinetic dewatering and thickening. I. Introduction and historical review of electrokinetic applications*, Sep. 1987, Journal of Applied Electrochemistry vol. 17, No. 5, pp. 889-898.

J. C. Rife et al., *Acousto- and electroosmotic microfluidic controllers*, 1998, Microfluidic Devices and Systems, vol. 3515, pp. 125-135.

Purnendu K Dasgupta et al., *Electroosmosis: A Reliable Fluid Propulsion System for Flow Injection Analysis*, 1994, Anal. Chem., vol. 66, No. 11, pp. 1792-1798.

Ray Beach et al., *Modular Microchannel Cooled Heatsinks for High Average Power Laser Diode Arrays*, Apr. 1992, IEEE Journal of Quantum Electronics, vol. 28, No. 4, pp. 966-976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754-760.

Y. Zhuang et al., *Experimental study on local heat transfer with liquid impingement flow in two-dimensional micro-channels*, 1997, Int. J. Heat Mass Transfer, vol. 40, No. 17, pp. 4055-4059.

D. Yu et al., *An Experimental and Theoretical Investigation of Fluid Flow and Heat Transfer in Microtube*, 1995, ASME / JSME Thermal Engineenng Conference, vol. 1, pp. 523-530.

Xiaoqing Yin et al., *Micro Heat Exchangers Consisting of Pin Arrays*, 1997, Journal of Electronic Packaging Mar. 1997, vol. 119, pp. 51-57.

X. Yin et al., *Uniform Channel Micro Heat Exchangers*, 1997, Journal of Electronic Packaging Jun. 1997, vol. 119, No. 2, pp. 89-94.

Chun Yang et al., *Modeling forced liquid convection in rectangular microchannels with electrokinetic effect*, 1998, International Journal of Heat and Mass Transfer 41 (1998), pp. 4229-4249.

Arel Weisberg et al., *Analysis of microchannels for integrated cooling*, 1992, Int. J. Heat Mass Transfer, vol. 35, No. 10, pp. 2465-2473.

Roger S. Stanley et al., *Two-Phase Flow in Microchannels*, 1997, DSE-vol. 62/HTD-vol. 354, MEMS, pp. 143-152.

B. X. Wang et al., *Experimental investigation on liquid forced-convection heat transfer through microchannels*, 1994, Int. J. Heat Mass Transfer, vol. 37 Suppl. 1, pp. 73-82.

Kambiz Vafai et al., *Analysis of two-layered micro-channel heat sink concept in electronic cooling*, 1999, Int. J. Heat Mass Transfer, 42 (1999), pp. 2287-2297.

Gokturk Tune et al.,*Heat transfer in rectangular microchannels*, 2002, Int. J. Heat Mass Transfer, 45 (2002), pp. 765-773.

D. B. Tuckerman et al., *High-Performance Heat Sinking for VLSI*, 1981, IEEE Electron Device Letters, vol. EDL-2, No. 5, pp. 126-129.

Bengt Sunden et al., *An Overview of Fabrication Methods and Fluid Flow and Heat Transfer Characteristics of Micro Channels*, pp. 3-23.

David S. Shen et al., *Micro Heat Spreader Enhance Heat Transfer in MCMs*, 1995, IEEE Multi-Chip Module Conference, pp. 189-194.

S. Sasaki et al., *Optimal Structure for Microgrooved Cooling Fin for High-Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611-617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology-part B, vol. 19, No. 2, pp. 444-451.

Charlotte Gillot et al., *Integrated Single and Two-Phase Micro Heat Sinks Under IGBT Chips*, IEEE Transactions on Components and Packaging Technology, vol. 22 No. 3, Sep. 1999, pp. 384-389.

X.F. Peng et al., "Enhancing the Critical Heat Flux Using Microchanneled Surfaces", Enhanced Heat Transfer, 1998, vol. 5 pp. 165-176.

H. Krumm "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

\* cited by examiner

PUMP AND FAN CONTROL CONCEPTS IN A COOLING SYSTEM

RELATED APPLICATION

This Patent Application claims priority under 35 U.S.C. 119 (e) of the co-pending U.S. Provisional Patent Application Ser. No. 60/489,730 filed Jul. 23, 2003, and entitled "PUMP AND FAN CONTROL APPARATUS AND METHOD IN CLOSED FLUID LOOP". The Provisional Patent Application, Ser. 60/489,730 filed Jul. 23, 2003, and entitled "PUMP AND FAN CONTROL APPARATUS AND METHOD IN CLOSED FLUID LOOP" is also hereby incorporated by reference.

FIELD OF THE INVENTION

This invention relates generally to the field of thermal management systems. More specifically, this invention relates to cooling heat-generating devices by using various temperature sensors, control schemes and thermal models, through the control of operating conditions of a pump and a fan in a cooling system.

BACKGROUND OF THE INVENTION

A variety of applications require cooling of devices that have very high heat fluxes, such as in the range of 50-1000 W/cm$^2$. These devices include integrated electronic circuits in microprocessors, laser diodes, and power semiconductor devices for control electronics.

In conventional electronic systems, such as computers, heat generated by one or more of these heat-generating devices is transferred to its surroundings through the use of a heat sink and one or more fans. Conventional heat sinks are passive except for the use of the fans, which can be controlled based on a signal from a temperature sensor within the computer or on the heat-generating device. The fans draw cool air into the heat sink and push warm air out. There may also be fans mounted directly on the heat sink. In some circumstances, the fan speed is controlled such that it increases when the device gets warmer and decreases when the device gets cooler. The goals of the heat sink and fan assembly are generally to keep the device below an acceptable maximum temperature.

What is needed is an improved cooling system that regulates both pump and fan speed in a concerted manner to maintain a heat-generating device within its allowed temperature range while conserving power and reducing system noise and transients thereof.

BRIEF SUMMARY OF THE INVENTION

According to a first aspect of the present invention, an apparatus for controlling a fluid flow rate of at least one pump and an air flow rate of at least one fan, in a cooling system for cooling at least one device is disclosed. The apparatus comprises a means for sensing a temperature value of the device. The means for sensing the temperature value can be at least one temperature sensor coupled to measure a temperature value of the device or devices. Alternatively, if the device is an electronic circuit, such as a microprocessor, the means for sensing the temperature value can be an electric current or electric power sensor from which temperature of the device is inferred. A controller is coupled to receive the temperature value and to selectively control the fluid flow rate, the air flow rate, or both based on the temperature value. The fluid system can be a closed loop system.

The apparatus can further include a heat exchanger thermally coupled to the device where at least a portion of the heat exchanger is filled with a thermal capacitance medium for maintaining the temperature value of the device below a maximum allowable temperature during thermal transients. The medium is preferably laterally distributed in the heat exchanger. Either the pump or the fan or both can be controlled such that the temperature value of the device is maintained below a maximum allowable temperature. Alternatively, one of the fan and pump can be maintained at a constant maximum speed and the other of the fan and pump controlled such that the temperature value of the device is maintained below a maximum allowable temperature such that acoustic transients are reduced. The pumps can be controlled independently of the fans. Alternatively, the pumps can be controlled cooperatively with the fans in a manner that optimizes one or more of several performance metrics.

The apparatus can further include at least one current sensor coupled to one or more devices, to provide information which is representative of the current delivered to the devices and indicative of the total electric power consumed by each of the devices. The total electric power consumed by each device is proportional to the steady-state operating temperature of that device. The controller is coupled to receive the information provided by the current sensors. The controller can adjust a current supplied to the pumps and the fans in response to the measured current values of each device. The controller can also adjust a voltage supplied to the pumps and the fans in response to the measured temperature values of each device. The system can have one or more pumps, fans, devices, heat exchangers, heat rejectors, controllers, and sensors.

The apparatus can also include a valve or valves for regulating the fluid flow rate. Each valve is selectively opened and closed to a variable state in response to one of the measured quantities, such as the temperature value of a device.

Power consumption of the cooling system can be reduced to a minimal level responsive to changes in demand for delivering power to each pump and fan. Time variations in noise level of each fan and pump can be minimized according to a predetermined criteria. A sum of the noise level of each fan and pump can be minimized. The temperature of each device can be maintained between a minimum temperature level and a maximum temperature level, while assuring that the power consumption of the cooling system is reduced to a minimum level.

In one embodiment, the controller can include a control algorithm based on a thermal time constant, wherein the thermal time constant is a product of a thermal resistance value and a thermal capacitance value. The thermal time constant can be applied to develop optimal control schemes for the pumps and the fans, in response to power consumed from the device or devices. The optimal control schemes can adjust the fluid flow rate of one or more pumps, the air flow rate of one or more fans, or both. For example, the optimal control schemes can include increase of fluid flow rate of the pump, with no increase of air flow rate of the fan. Alternatively, the optimal control schemes can include increase of fluid flow rate of the pump, with a gradual increase of air flow rate of the fan, thus reducing acoustic transients. Alternatively, the optimal control scheme can include decrease of fluid flow rate of the pump, with no change of air flow rate of the fan.

According to an alternative aspect of the present invention, an apparatus for controlling a fluid flow rate of at least one pump in a cooling system for cooling at least one device is disclosed. The apparatus comprises at least one temperature sensor for measuring a temperature of the device, the fluid, or both. Alternatively, the power consumed by the device can be measured and used to estimate the temperature of the device. The apparatus also includes at least one controller for varying the fluid flow rate of the pump based on the temperature of the device. The controller preferably drives each pump at roughly a constant low fluid flow rate when the measured device temperature is below a predetermined temperature value and at roughly a constant high fluid flow rate when the measured fluid temperature is above the predetermined temperature value. Further, the controller preferably drives each pump at a minimum pump voltage or pump current when the measured device temperature is below a predetermined minimum temperature value and at a maximum pump voltage or pump current when the measured device temperature is above a predetermined maximum temperature value. The controller can drive each pump between a pump minimum flow rate and a pump maximum flow rate in response to the measured device temperature.

The system can further include at least one fan, wherein the one or more pumps are controlled in response to the measured device temperature while the fan remains at a roughly constant operational state, thereby minimizing time variations of noise level generated by the fans and the pumps. The time variations of noise level of the pumps can be minimized according to predetermined criteria. The noise level generated by each pump can be maintained at a minimum noise level.

In another embodiment of the present invention, a method of controlling a fluid flow rate of at least one pump and an air flow rate of at least one fan, in a cooling system for cooling at least one device is disclosed. The method comprises the steps of: providing at least one temperature sensor coupled to measure a temperature value of each device; receiving the temperature value from each temperature sensor; and providing a controller to selectively control the fluid flow rate and the air flow rate, based on each temperature value. The method can further include the step of filling at least a portion of a heat exchanger with a thermal capacitance medium for maintaining the temperature value of the device below a maximum allowable temperature during thermal transients, wherein the heat exchanger is thermally coupled to the device.

In another embodiment of the present invention, an apparatus for controlling a fluid flow rate of at least one pump and an air flow rate of at least one fan, in a cooling system for cooling at least one device, is disclosed. The apparatus comprises at least one circuit for measuring a current consumed by the device and for forming a signal representative thereof; and a controller coupled to receive the signal and to selectively control the fluid flow rate and the air flow rate, in response thereto.

DETAILED DESCRIPTION OF THE INVENTION

Reference will now be made in detail to the preferred and alternative embodiments of the invention, examples of which are illustrated in the accompanying drawings. While the invention will be described in conjunction with the preferred embodiments, it will be understood that it is not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be noted that the present invention may be practiced without these specific details. In other instances, well known methods, procedures and components have not been described in detail as not to unnecessarily obscure aspects of the present invention.

Figure 1:
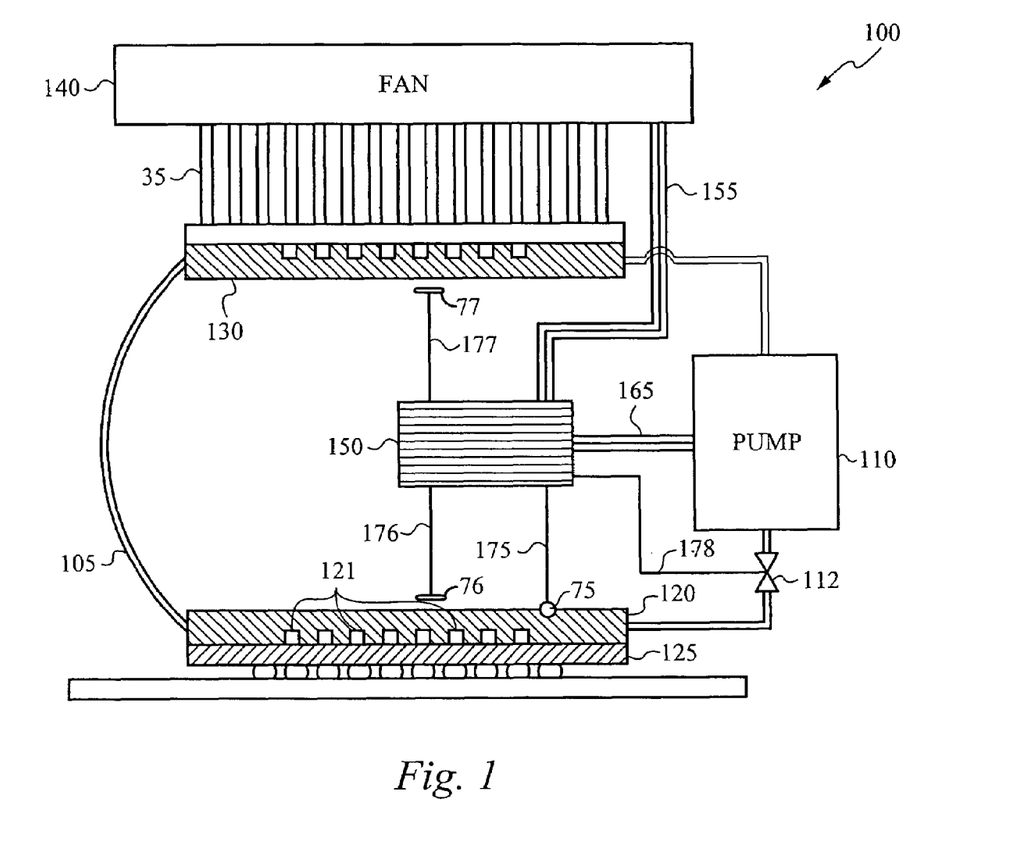
FIG. 1 illustrates a cooling system in accordance with an embodiment of the present invention.

Referring now to the drawings and particularly to FIG. 1, there is shown one embodiment of a cooling system 100, which can include a hermetically sealed loop, that can be used in the apparatus and method of the present invention. The system 100 comprises a heat exchanger 120, in which a fluid absorbs heat from a heat-generating device 125, a heat rejector 130, which transfers heat from the liquid to a surrounding ambient environment, and a pump 110, which forces the fluid to flow through the heat exchanger 120 and then through the heat rejector 130. Though the heat exchanger 120 includes microchannels 121, it will be appreciated by those of ordinary skill in the art that other types of heat exchangers can be used under the teachings of the present invention including those without microchannels. For example, as an alternative the heat-generating device 125 can be designed with internal flow regions or microchannels built into the heat-generating device 125. The heat-generating device 125, of which the system 100 can include one of many types of heat sources including but not limited to an integrated electronic circuit in microprocessors, laser diodes, and power semiconductor devices for control electronics. The fluid travels through the system 100 via a fluid transport line 105.

The system 100 circulates either the fluid without phase change or with phase change, such as boiling, and then condensing at the heat rejector 130. The heat rejector 130 can include a plurality of fins 135 for further assisting in conducting heat away from the system 100. The heat rejector 130 can be coupled to a fan 140 via the fins 135, and is therefore positioned in an airflow path of the fan 140. However, the fan can be located at any location in the system 100.

The pump 110 and the fan 140 are responsive to a controller 150. The controller 150 receives data input through electrical signal paths 155, 165, 175, 176, and 177, to numerous sensors, for example temperature sensors 75, 76, and 77, positioned to measure a heat operating level of the heat-generating device 125, the temperature within the heat exchanger 120, and the heat of the air around the heat exchanger 120 and the heat rejector 130. The heat operating level can be a die temperature during operation of the system 100. Temperature sensors (not shown) can also be located within the heat rejector 130, the fins 135, the pump 110, and anywhere along the fluid transport line 105 for the fluid at any point in the system 100. The temperature sensor (not shown) can also be embedded in the device 125 and a representative signal can be provided by the device 125. Additional electrical signal paths (not shown) can be coupled to the heat rejector 130, the fins 135, anywhere along the fluid transport line 105, and to any location where there is a sensor. The sensors generate signals that represent the temperature sensed and transmit those signals over the electrical signal paths 155, 165, 175, 176, 177 and 178, to the controller 150. Also, the system 100 can include current sensors (not shown) and pressure sensors (not shown) for one or more heat-generating devices in the system 100. The current sensors (not shown) and the pressure sensors (not shown) can generate an output signal proportional to temperature. In addition to temperature sensors, current sensors and pressure sensors, ambient temperature sensors 76 and 77 to measure temperature values of ambient air around the heat-generating device 125, and flow rate sensors 112 with corresponding flow valves 112 can be added. It should also be understood, in accordance with the present invention, that the controller 150 can be configured to simultaneously respond to multiple sensors, or to modify an operating state of various components such as the pump 110 and the fan 140. The present invention further discloses a system having one or more pumps, fans, heat-generating devices, heat exchangers, heat rejectors, controllers, and sensors.

The controller 150 coordinates the various signals received and controls a flow rate of the pump 110 and an airflow of the fan 140, via wires 165 and 155, respectively, in response thereto. For example, the controller 150 can actuate the pump 110 to increase an amount of flow if the temperature of the heat-generating device 125 is above a specified temperature, or it can decrease the amount of heat being removed if the temperature of the heat-generating device 125 is below the specified temperature. Alternatively, the controller 150 can stop the pumping of the fluid altogether when the temperature of the heat-generating device 125 falls below the specified temperature. As mentioned above, the controller 150 can also regulate the airflow of the fan 140. For example, the controller 150 can actuate the fan 140 to increase airflow if the temperature of the heat-generating device 125 is above the specified temperature, or it can decrease the airflow of the fan 140 if the temperature of the heat-generating device 125 is below the specified temperature. Alternatively, the controller 150 can stop the airflow of the fan 140 altogether when the temperature of the heat-generating device reaches the specified temperature. It should also be understood, in accordance with the present invention, that the controller 150 can be configured to control both the pump 110 and the fan 140 cooperatively or independently to achieve and maintain proper regulation of the system 100, and also to reduce power consumption of the system 100 to a minimal level responsive to changes in demand for delivering power to the pump 110 and the fan 140. Alternatively, the controller 150 can be configured to reduce an acoustic noise level of the system 100 to a minimal level responsive to changes in demand for delivering power to the pump 110 and the fan 140.

An important feature of the present invention is that a temperature value of the heat-generating device 125 can be maintained between a minimum temperature level and a maximum temperature level, such that the power consumption of the system 100 or the acoustic noise level of the system 100 or both is reduced to a minimum level. Further, the controller 150 can be coupled to a control valve 112 of the system 110. Thus, the controller 150 can open or close the control valve 112 to a variable opening position in response to the temperature value. The controller 150 can also control the pump 110 and the fan 140 in response to the temperature of the heat-generating device 125 and/or the fluid at any location in the system 100.

In prior art cooling systems utilizing conventional heat sinks, when fan voltage is reduced to reduce noise, the heat sink temperature immediately increases. At the same time, the temperature of the heat-generating device will increase accordingly. In the present invention, the system 100 can reduce noise generated by the fan 140 and/or the pump 110 while maintaining adequate cooling of the heat-generating device 125. The pump 110 and the fan 140 can have relationships between speed and noise. Further, time variations in noise level of at least one of the fan 140 and the pump 110 can be minimized according to predetermined criteria. If the pump 110 is an electrokinetic pump, for example, it will be silent or nearly silent during operation. Therefore, the system 100 can minimize noise by operating the pump 110 at a maximum flow rate, and operating the fan 140 at a minimum rate which provides adequate cooling performance. Alternatively, the pump 110 and the fan 140 can have relationships between noise and power. The system can be optimized to provide adequate cooling power while minimizing power consumption of the fan 140 and the pump 110. In addition, the system 100 can control "operational states" for the fan 140 and the pump 110, such as voltage, current, or an operational curve relating pressure to flow rate for the pump 110 and/or the fan 140, to maximize reliability, or to minimize other desirable characteristics, such as changes in the speed of the fan 140, variations in the airflow of the fan 140 past other components or parts of the system 100, EMI (electromagnetic interference) generation by the fan, accumulation of dust, and so forth. As an example, the controller 150 can gather data relating fan speed to power consumption and airflow of the fan 140. With the heat exchanger 120 and the heat rejector 130 as components of the system 100, it is possible to characterize thermal performance of the system 100 as a function of the "operational states" of the fan 140 and the pump 110.

The system 100 can be characterized in general as single-input-multiple-output (a single thermal input signal used to control one or more pumps and one or more fans), or multiple-input-multiple-output (more than one input signal used to control one or more pumps or one or more fans). The present invention discloses the use of single-input-multiple-out or multiple-input-multiple-output control systems for all electronic cooling systems that include at least one pump and at least one fan.

Another inventive feature of the present invention is that the controller 150 can use a cost function for optimization of various components, such as the heat exchanger 120, to minimize operation costs while maintaining adequate cooling conditions within the system 100. Optimization can be achieved by determining the power consumption of the system at minimal levels, the time variations at a minimal noise level, the temperature values maintained between the minimum and maximum temperature levels, and the noise level generated and maintained at the minimum noise level.

Figure 2:
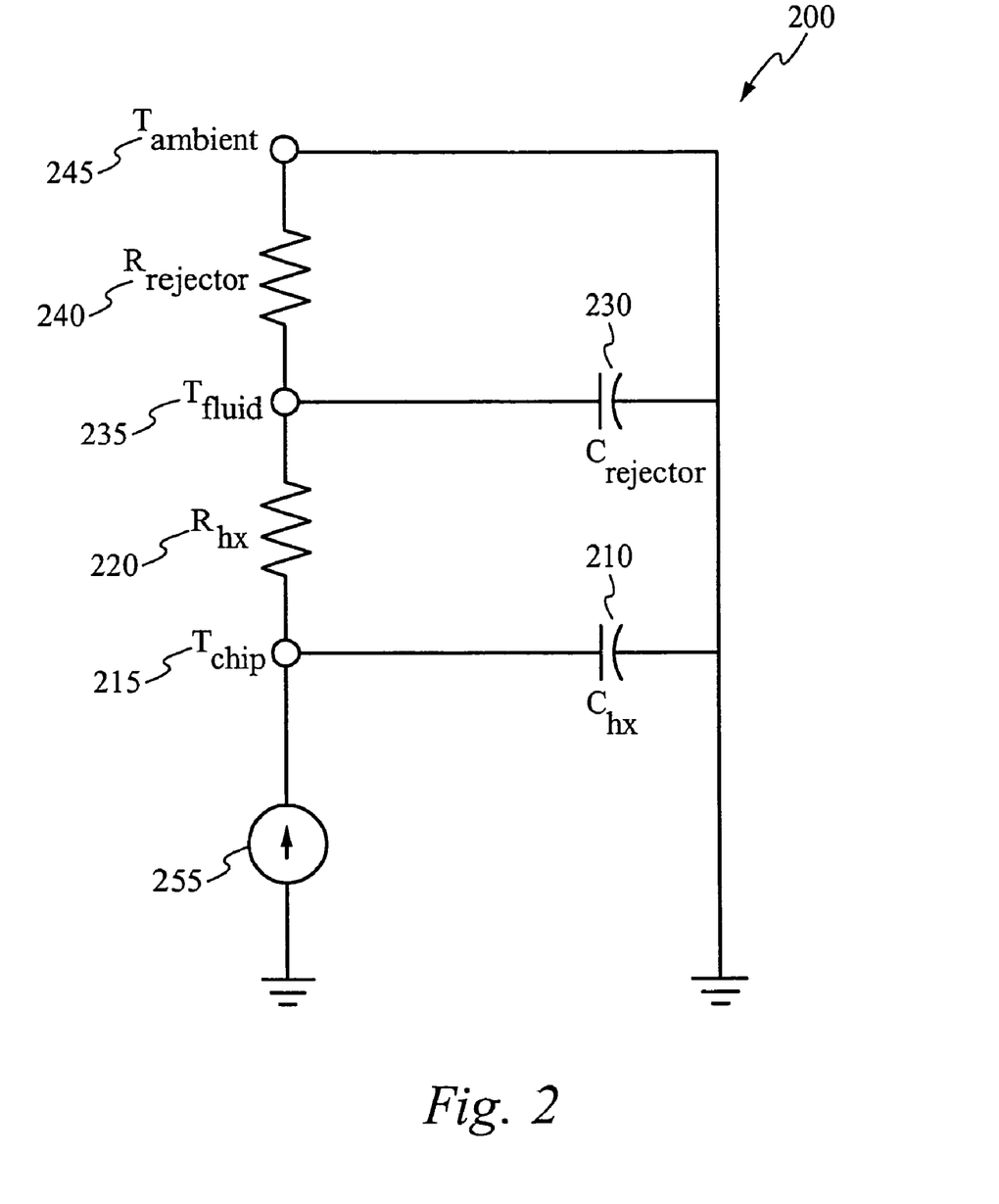
FIG. 2 illustrates a thermal circuit model for a cooling system in accordance with the present invention.

FIG. 2 is a thermal circuit model 200 for a cooling system, which is analogous to an electrical circuit. The thermal circuit model 200 divides the system into two separate groups of thermal resistors and thermal capacitors between three temperature nodes, namely, heat-generating device temperature 215, the average fluid temperature 235, and ambient air temperature 245. A heat exchanger thermal resistance 220 depends on a pump flow rate geometry, material and design of the heat exchanger. A heat rejector thermal resistance 240 depends on the pump flow rate and a fan flow rate. The thermal resistance is described by a rise in temperature for each unit in thermal resistance passing through the material. A heat exchanger thermal capacitance 210 and a heat rejector thermal capacitance 230 describe an amount of energy taken in by those components for each degree of temperature rise. A current source 255 models the thermal power output of the heat-generating device.

According to the thermal circuit model 200, the ambient air temperature 245, modeled as an electrical circuit node, is coupled to a first terminal of the heat rejector thermal resistance 240, modeled as a electrical resistor, and also to ground. A second terminal of the heat rejector thermal resistance 240 is coupled to the average fluid temperature 235, modeled as an electrical circuit node, and also to a first terminal of the heat rejector thermal capacitance 230, which is modeled as an electrical capacitor. A second terminal of the heat rejector thermal capacitance 230 is coupled to ground. The fluid temperature 235 is also coupled to a first terminal of the heat exchanger thermal resistance 220, modeled as an electrical resistor. A second terminal of the heat rejector thermal resistance 240 is coupled to the heat-generating device temperature 215, modeled as an electrical circuit node, and also to a first terminal of the heat exchanger thermal capacitance 210, which is modeled as an electrical capacitor. The heat-generating device temperature is also coupled to the thermal output of the heat-generating device which is modeled as an electrical current source 255.

In one embodiment of the present invention, a portion of the heat exchanger 120 (FIG. 1) can be filled with a thermal capacitance medium for maintaining the temperature value of the heat-generating device 125 (FIG. 1) below a maximum allowable temperature during a thermal transient or increase in power output. The medium can consist of high specific heat materials and is preferably laterally distributed in the heat exchanger 120 (FIG. 1).

A thermal resistance represents a ratio of a temperature difference between, for example, the heat-generating device 125 (FIG. 1) and the fluid in the heat exchanger 120 (FIG. 1) divided by heat power removed from the heat-generating device 125 (FIG. 1). This parameter has units of degrees/watt, and small ratio values represent better system performance than large ratio values. As an example, if the ambient air temperature is 40 degrees Celsius and the heat-generating device 125 (FIG. 1) cannot operate above 100 degrees Celsius, and the power consumption is 60 Watts, the thermal resistance must be lower than 1 degrees/Watt. A higher thermal resistance would lead to a higher operating temperature for the heat-generating device 125 (FIG. 1). Total resistance between the heat-generating device 125 (FIG. 1) and the ambient air is the sum of the heat-generating device-fluid temperature resistor 220 and the fluid-ambient resistor 240. For a control scheme where both fan speed and pump flow rate are controllable, it is useful and approximately correct to break the system resistance into the two resistors 220 and 240, as shown in FIG. 2, and to associate the two resistors 220 and 240 with the capacitors 210 and 230 as indicated in FIG. 2.

The thermal resistance between the heat-generating device 125 (FIG. 1) and the fluid decreases with increasing values of the flow rate of the pump 110 (FIG. 1). For a given value of total thermal resistance, there can be many combinations of pump and fan speed that provide an adequate system performance. In general, it is possible to reduce the speed of the fan 140 (FIG. 1) and increase the speed of the pump 110 (FIG. 1) and still maintain adequate system performance. This would result in a decrease in the heat exchanger thermal resistance 220 ($R_{hx}$) and an increase in the heat rejector thermal resistance 240 ($R_{rejector}$). Since the pump and fan can be independently controlled, it is possible to arrange for a fixed total thermal resistance while changing the pump and fan operation such that: $R_{hx}+R_{rejector}$=constant). This would allow optimization of some other parameter, such as total power or total noise, while maintaining desired cooling system performance.

The controller 150 (FIG. 1) can include a control algorithm based on a thermal time constant, which is the product of thermal resistance and thermal capacitance. The thermal capacitance of the heat exchange and the heat rejector can be adjusted by changing the mass of their respective structures, by changing their materials or by adding a layer of material with different thermal properties.

As an example, consider the case that the heat-generating device is a microprocessor. The amount of electric power consumed by the device varies substantially as the tasks performed by the microprocessor change. Typical microprocessors have a maximum allowable temperature (MAT). Ideally, the microprocessor is allowed to operate at a relatively high temperature, just below the MAT, so that the electric power consumed by and also the acoustic noise generated by the cooling are both minimized.

Figure 6:
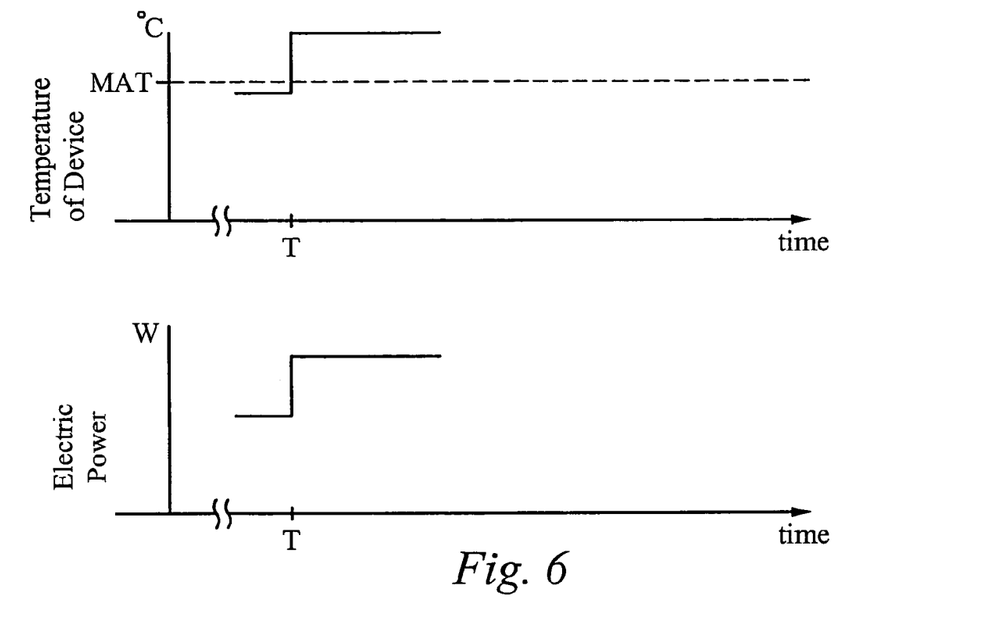
FIG. 6 illustrates the temperature and power consumption of the device of FIG. 1 as a function of time under both steady state conditions prior to a time T and during a surge in power consumption of the device at time T.
Figure 7:
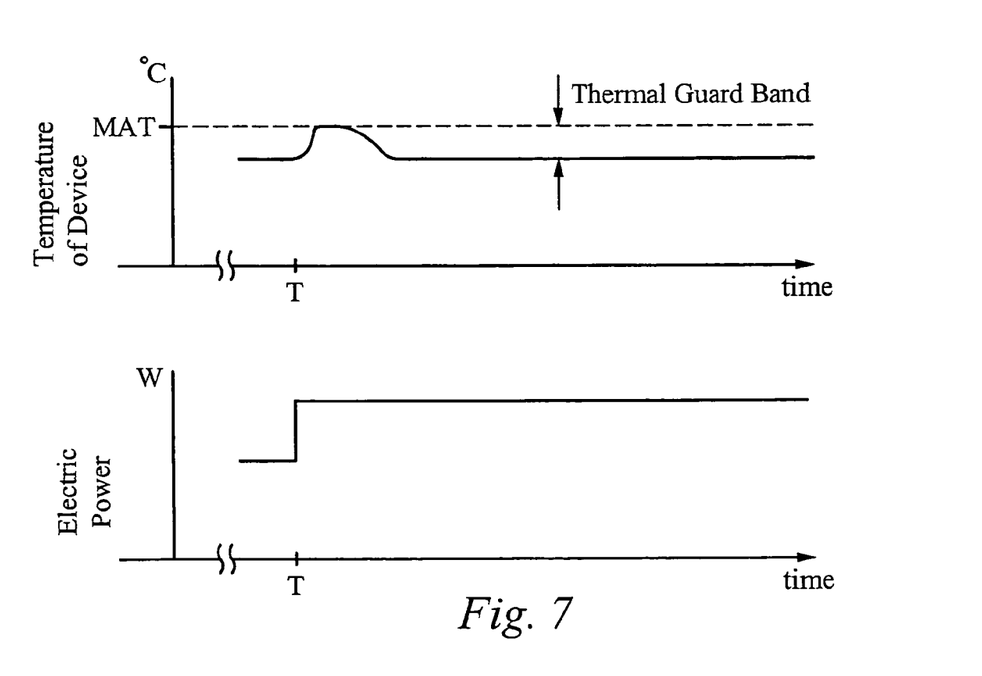
FIG. 7 illustrates the effect of introducing thermal capacitance to the system of FIG. 1 so that the temperature of the device of FIG. 1 is maintained below a maximum allowable temperature during a surge in power consumption of the device at time T.

As the amount of electric power changes the temperature of the device changes nearly immediately in the absence of the present invention. FIG. 6 shows a microprocessor initially operating in steady state, with a temperature lower than the MAT. At a time T, the electric power (in Watts) consumed by the microprocessor increases. The temperature of the device rises very quickly. With prior art systems, the temperature of the microprocessor would need to operate much lower than the MAT or else increases in power consumption would allow the temperature to exceed the MAT. This is especially true because prior art systems could not react quickly to changes in device temperature The present invention contemplates appropriately selecting the thermal capacitance to accommodate transient power signals. By adjusting the thermal capacitance of the system of the present invention, the time for the device to increase in temperature increases is slowed. In FIG. 7, the microprocessor again increases its electric power consumption at time T. However, because the thermal capacitance of the system is increased, the temperature of the microprocessor increases relatively slowly allowing the system ample time to compensate for the increased thermal power output of the microprocessor by appropriately adjusting the fluid flow rate of the pump or the air flow rate of the fan or both as discussed herein. This allows the designer to select a thermal capacitance relative to the desired thermal guardband to control the amount of electric power consumed by the one or more pumps and the one or more fans in the system. As the thermal capacitance is decreased, the thermal guardband is correspondingly increased such that more electric power is consumed by the cooling system of the present invention. Likewise, as the thermal capacitance is increased, the thermal guardband is correspondingly decreased and less electric power is consumed by the cooling system.

Control schemes can be developed and based on a thermal time constant. The thermal time constant can be applied to develop optimal control schemes for the pump 110 (FIG. 1) and the fan 140 (FIG. 1), in response to temporal power signal consumed by the heat-generating device 125 (FIG. 1). For example, upon knowing the thermal time constant of the heat exchanger (FIG. 1), and a range of power surges of the heat generating device 125 (FIG. 1), optimal control schemes can be designed to operate the fan 140 (FIG. 1) and the pump 110 (FIG. 1) so that the temperature of the heat generating device 125 (FIG. 1) is maintained at a "margin" below a maximum temperature at normal operating conditions. During a power surge of the heat generating device 125 (FIG. 1), the pump 110 (FIG. 1) and the fan 140 (FIG. 1) will react immediately, but the device 125 (FIG. 1) temperature will not exceed beyond the maximum temperature, therefore not allowing the heat generating device 125 (FIG. 1) to throttle back. This feature of the present invention allows the heat generating device 125 (FIG. 1) to operate at full performance regardless of any power surge while also reducing transients in acoustics.

The optimal control schemes can also include an increase of fluid flow rate of the pump 110 (FIG. 1), with no increase of air flow rate of the fan 140 (FIG. 1). Alternatively, the optimal control schemes can include an increase of the air flow rate of the fan 140 (FIG. 1), with no increase in the fluid flow rate of the pump 110 (FIG. 1). The fan speed can be increased slowly in order to reduce any acoustic transients. The optimal control schemes can include use of empirical data for developing the optimal control schemes. The empirical data can include temperature measurements of each heat-generating device 125 (FIG. 1), the fluid in the heat rejector 130 (FIG. 1), and the fluid in the heat exchanger 120 (FIG. 1), as a function of either pump flow rate of the pump 110 (FIG. 1) or air flow rate of the fan 140 (FIG. 1), or both.

The use of a current sensor in the system provides some unique advantages. The current sensor directly detects the power input to the heat generating device, and is therefore a predictor of temperature changes. The temperature sensors have delayed responses because of the thermal time constants. Therefore a control system based on a current sensor can cause changes in pump and fan voltages that provide faster response to transients and more accurate control. In particular, an abrupt rise in current can be handled by producing an abrupt rise in pump flow rate, since the pump has a faster cooling response than the fan.

Figure 3:
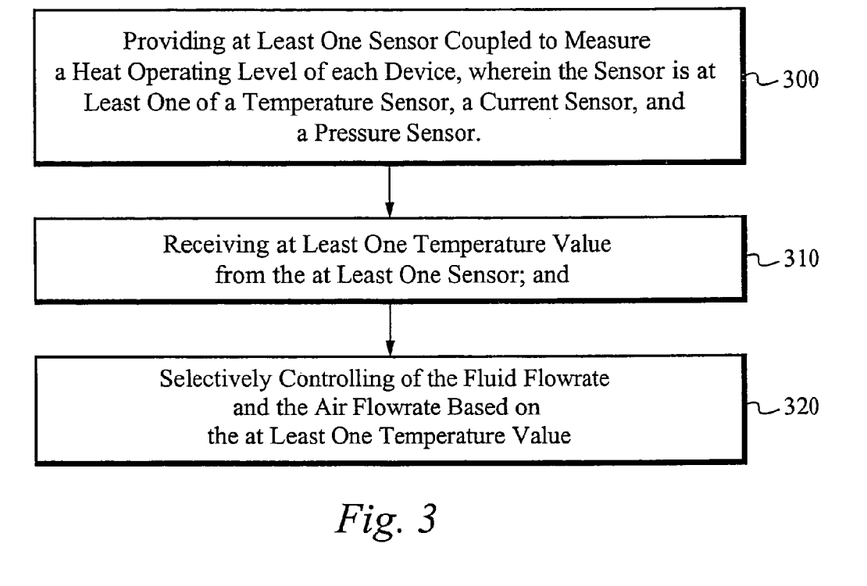
FIG. 3 is a schematic flowchart illustrating steps of an alternative method of the present invention.

In another embodiment of the present invention, as shown in FIG. 3, a method of controlling a fluid flow rate of at least one pump and an air flow rate of at least one fan, in a cooling system for cooling at least one device, is disclosed. In the step 300, at least one sensor is provided, wherein the sensors can be temperature sensors, current sensors, or pressure sensors. Each sensor is coupled to measure a temperature value of each device; In the step 310, at least one temperature value from the at least one sensor is received. In the step 320, the fluid flow rate and the airflow rate are selectively controlled based on the temperature value.

Figure 4A:
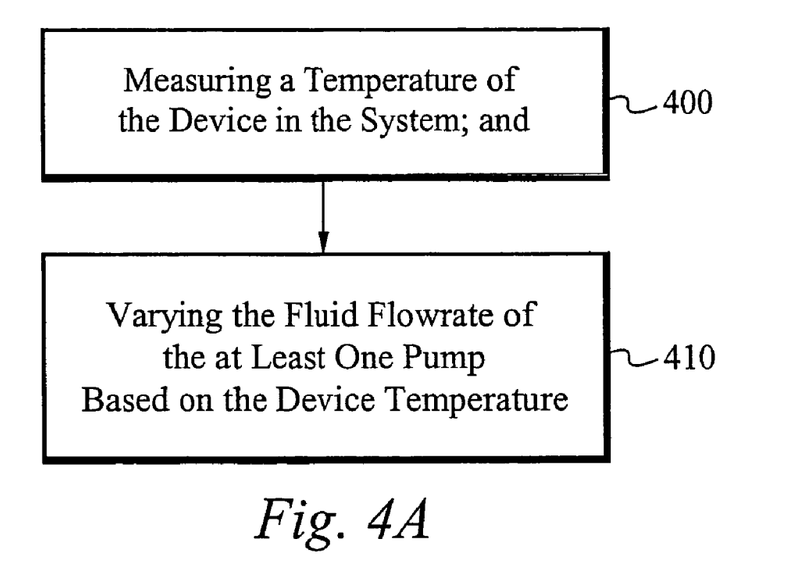
FIG. 4A is a schematic flowchart illustrating steps of an alternative method of the present invention.

In another embodiment of the present invention, as shown in FIG. 4A, a method of controlling a fluid flow rate of at least one pump in a cooling system for cooling at least one device is disclosed. In the step 400, a temperature of the device is measured. In the step 410, the fluid flow rate of the at least one pump is varied based upon the device temperature.

Figure 4B:
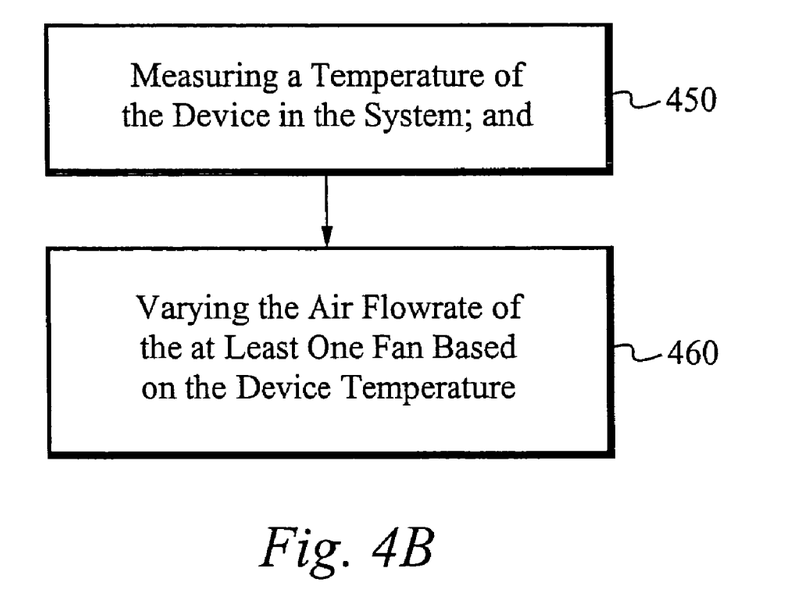
FIG. 4B is a schematic flowchart illustrating steps of an alternative method of the present invention.

In another embodiment of the present invention, as shown in FIG. 4B, a method of controlling an air flow rate of at least one fan in a cooling system for cooling at least one device is disclosed. In the step 450, a temperature of the device in the system is measured. In the step 460, the air flow rate of the at least one fan is varied based upon the device temperature.

Figure 5:
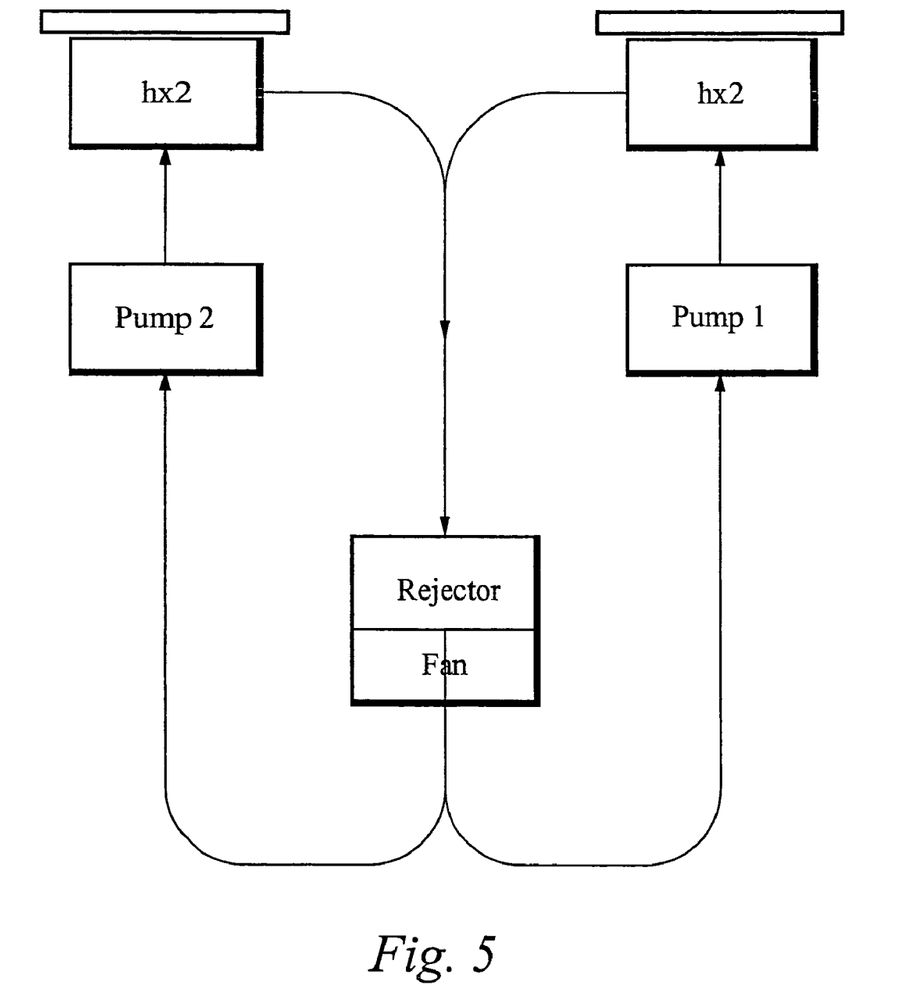
FIG. 5 illustrates a schematic diagram of an alternative system of the present invention.

As mentioned, the present invention further discloses a system having one or more pumps, fans, heat-generating devices, heat exchangers, heat rejectors, controllers, and sensors. For example, as shown in FIG. 5, a cooling system can include two pumps, two heat exchangers, one heat rejector and one fan, or other combinations.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A method of controlling a fluid flow rate and an air flow rate, for cooling at least one heat-generating device in a cooling system comprising a controller, at least one sensor, at least one fan for generating an air flow, and a fluid loop comprising at least one pump for generating a fluid flow, a heat rejector, a heat exchanger mechanically and thermally coupled with the at least one heat-generating device, and a thermally conductive fluid, the method comprising the steps of:
    measuring a first temperature using the at least one sensor, wherein the at least one sensor is a first temperature sensor coupled to the heat exchanger and positioned to measure the temperature within the heat exchanger;
    pumping the thermally conductive fluid through the fluid loop;
    controlling the fluid flow rate and the air flow rate based on the first temperature such that the first temperature is maintained below a maximum allowable temperature, wherein the controller controls the at least one fan and the at least one pump to set the fluid flow rate and the air flow rate.

2. The method of claim 1, further comprising the step of measuring the fluid flow rate wherein the fluid loop includes a flow rate sensor that measures the fluid flow rate and wherein the step of controlling the fluid flow rate and the air flow rate includes measuring the fluid flow rate.

3. The method of claim 1, further comprising the steps of providing a flow valve in the fluid loop and controlling the flow valve, wherein the fluid loop includes the flow valve that controls the flow rate in and wherein the step of controlling the fluid flow rate and the air flow rate includes adjusting the flow valve.

4. The method of claim 1, wherein the at least one device comprises an electronic circuit.

5. The method of claim 1, wherein the heat exchanger contains internal flow regions for distributing fluid, and wherein the fluid is distributed through the internal flow regions of the heat exchanger.

6. The method of claim 5, wherein the internal flow regions comprise microchannels.

7. The method of claim 1, wherein at least one additional temperature sensor measures at least one additional temperature value in the cooling system.

8. The method of claim 7, further comprising the step of measuring the temperature of the ambient air around the at least one heat-generating device, wherein the at least one additional temperature sensor measures the ambient air temperature and wherein the step of controlling the fluid flow rate and the air flow rate is further based on the measured ambient air temperature.

9. The method of claim 7, further comprising the step of measuring the temperature of the fluid within the cooling loop, wherein the at least one additional temperature sensor measures the fluid temperature at a point in the cooling loop.

10. The method of claim 7, further comprising the step of measuring the temperature of the ambient air around the heat rejector, wherein the at least one additional temperature sensor measures the ambient air temperature around the heat rejector and wherein the step of controlling the fluid flow rate and the air flow rate is further based on the measured ambient air temperature.

* * * * *

UNITED STATES PATENT AND TRADEMARK OFFICE
CERTIFICATE OF CORRECTION

PATENT NO. : 7,591,302 B1  Page 1 of 1
APPLICATION NO. : 10/731674
DATED : September 22, 2009
INVENTOR(S) : Lenehan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 719 days.

Signed and Sealed this

Fourteenth Day of December, 2010

David J. Kappos
*Director of the United States Patent and Trademark Office*